(12) United States Patent
Bergman et al.

(10) Patent No.: US 6,605,958 B2
(45) Date of Patent: Aug. 12, 2003

(54) PRECISION ON-CHIP TRANSMISSION LINE TERMINATION

(75) Inventors: Dave Bergman, Colleyville, TX (US); Yaqi Hu, Plano, TX (US); Jim McDonald, Plano, TX (US); Kok-Lean Tan, Kota Kinabalu (MY)

(73) Assignee: Vitesse Semiconductor Corporation, Camarillo, CA (US)

( * ) Notice: Subject to any disclaimer, the term of this patent is extended or adjusted under 35 U.S.C. 154(b) by 0 days.

(21) Appl. No.: 09/974,451

(22) Filed: Oct. 9, 2001

(65) Prior Publication Data

US 2002/0114146 A1 Aug. 22, 2002

Related U.S. Application Data

(60) Provisional application No. 60/239,704, filed on Oct. 11, 2000.

(51) Int. Cl.[7] .............................................. H03K 17/16
(52) U.S. Cl. .............................. 326/30; 326/86; 326/90; 327/108
(58) Field of Search ............................ 326/30, 86, 90, 326/31–34; 327/108; 333/32

(56) References Cited

U.S. PATENT DOCUMENTS

| | | | | |
|---|---|---|---|---|
| 5,864,584 A | * | 1/1999 | Cao et al. ................... | 375/244 |
| 6,046,653 A | * | 4/2000 | Yamada ....................... | 333/32 |
| 6,157,206 A | * | 12/2000 | Taylor et al. ................ | 326/30 |
| 6,424,169 B1 | | 7/2002 | Partow et al. | |

* cited by examiner

Primary Examiner—Michael Tokar
Assistant Examiner—Vibol Tan
(74) Attorney, Agent, or Firm—Christie, Parker & Hale, LLP

(57) ABSTRACT

Methods and apparatus for providing precision on-chip termination of transmission lines are provided which enable the termination of transmission lines using on-chip resistors configured into networks, which have resistances related to the resistance of an external reference resistor. The external reference resistor is used to configure an on-chip reference resistor network so that it has a resistance related to the resistance of the external reference resistor. Termination resistor networks are then configured so that their resistances bear a predetermined relationship to the resistance of the on-chip reference resistor network. In one embodiment the resistance of each of the termination resistor networks is substantially the same as the characteristic impedances of each of the transmission lines.

34 Claims, 14 Drawing Sheets

PRECISION ON-CHIP TRANSMISSION LINE TERMINATION

CROSS-REFERENCE TO RELATED APPLICATION(S)

This application claims the benefit of provisional Application 60/239,704 filed Oct. 11, 2000, the disclosure of which is incorporated herein by reference.

BACKGROUND OF THE INVENTION

The present invention relates to high speed transmission of data and in particular to systems and methods of terminating transmission lines.

Use of high speed data lines is widely prevalent. Often transmission speeds are above 1 Gbps. At high data transmission speeds a data line behaves in some respects as a transmission line and transmission line effects can result in ringing and distortion of the transmitted signal. Transmission line effects can be minimized by placing a termination resistor of resistance equal to the characteristic impedance of the transmission line at the receiver end of the transmission line and thereby impedance match the transmission line and the termination resistor.

When the receiver is a semiconductor device, a number of difficulties in impedance matching the transmission line may arise. For example, a number of problems are presented by using a termination resistor external to the receiving semiconductor device. When external termination resistors are used, a separate resistor is generally required for each transmission line. These resistors increase the complexity of the PCB because they occupy valuable area on the circuit board. In addition, termination resistors mounted on a PCB are unable to prevent transmission line effects due to unterminated transmission line stubs between the resistors and a receiving semiconductor device.

Other problems are presented when transmission lines are terminated using on-chip resistors. Process variation in the manufacture of semiconductor devices can result in variations in resistor resistance of, for example, up to ±30%. This varying resistance value can result in improper termination values. Furthermore, once the internal termination resistor is included on-chip, changing the resistance becomes difficult.

SUMMARY OF THE INVENTION

The present invention provides a method and apparatus for providing precision on-chip termination of transmission lines. One embodiment of the invention includes a first reference resistor and an integrated circuit, which includes a resistor network and control circuitry. The configuration of the resistor network is capable of being controlled by the control circuitry such that the resistance of the resistor network is related to the resistance of the reference resistor.

A further embodiment includes a first reference resistor, an integrated circuit, which includes a resistor network and control circuitry and a transmission line connected to the integrated circuit. The resistor network provides a termination resistance across the transmission line and the configuration of the resistor network is capable of being controlled by the control circuitry such that the resistance of the resistor network is related to the resistance of the reference resistor. In a further embodiment of the invention, the integrated circuit also includes a reference resistor network and reference resistor network control circuitry. The configuration of the reference resistor network is capable of being controlled by the reference resistor control circuitry such that the resistance of the reference resistor network is related to the resistance of the reference resistor. The configuration of the resistor network is also capable of being controlled by the control circuitry such that the resistance of the resistor network is related to the resistance of the reference resistor network. In addition, the resistance of the external reference resistor is chosen so that the resistance of the resistor network is substantially the same as the characteristic impedance of the transmission line.

A further embodiment of the invention involves controlling the configuration of a termination resistor network on an integrated circuit such that the resistance of the termination resistor network is related to the resistance of a reference resistor located on the printed circuit board. A further embodiment of the invention also involves controlling the configuration of a reference resistor network on the integrated circuit such that the resistance of the reference resistor network is related to the resistance of a reference resistor located on the printed circuit board. In addition the termination reference resistor network is configured such that the resistance of the termination resistor network is related to the resistance of the reference resistor network. The configuring step causes the termination resistor network to have substantially the same configuration as the reference resistor network. A further embodiment involves the resistance of the reference resistor being chosen such that the resistance of the termination resistance network is substantially the same as the characteristic impedance of the transmission line.

DETAILED DESCRIPTION

Figure 1:
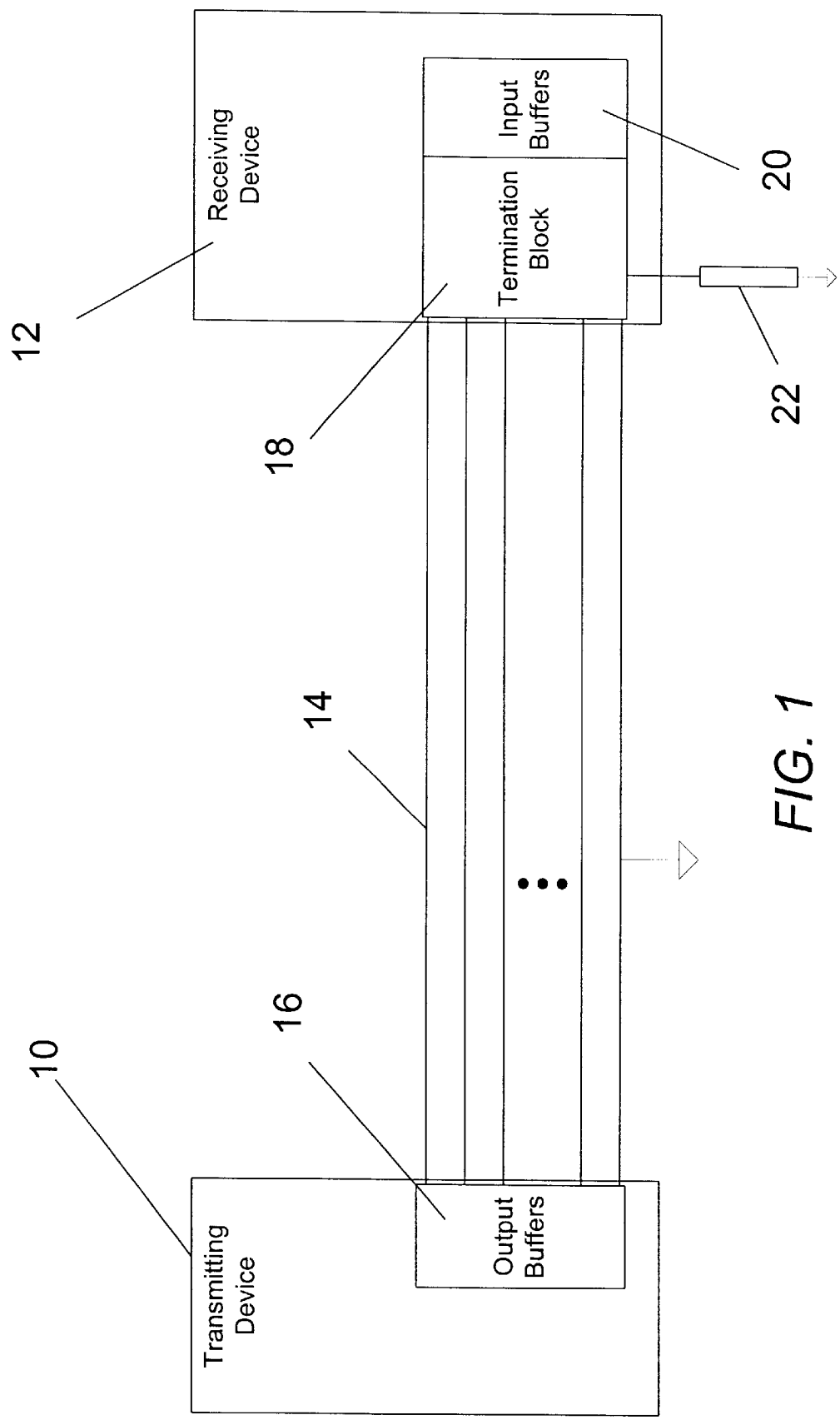
FIG. 1. is a block diagram schematically illustrating components of a transmission system.

A system in accordance with the present invention is illustrated in FIG. 1. In the example shown in FIG. 1, the system comprises a transmitting device 10 and a receiving device 12. The transmitting device and the receiving device are connected via transmission lines 14. The receiving device includes a termination block 18, which terminates the transmission lines. The termination block is also connected to an external reference resistor 22.

The termination block terminates each transmission line by a termination resistance related to the resistance of the external reference resistor. In one embodiment, the value of the external reference resistor is chosen so that each transmission line is terminated by a termination resistance substantially equal to the characteristic impedance of the transmission line.

Figure 2:
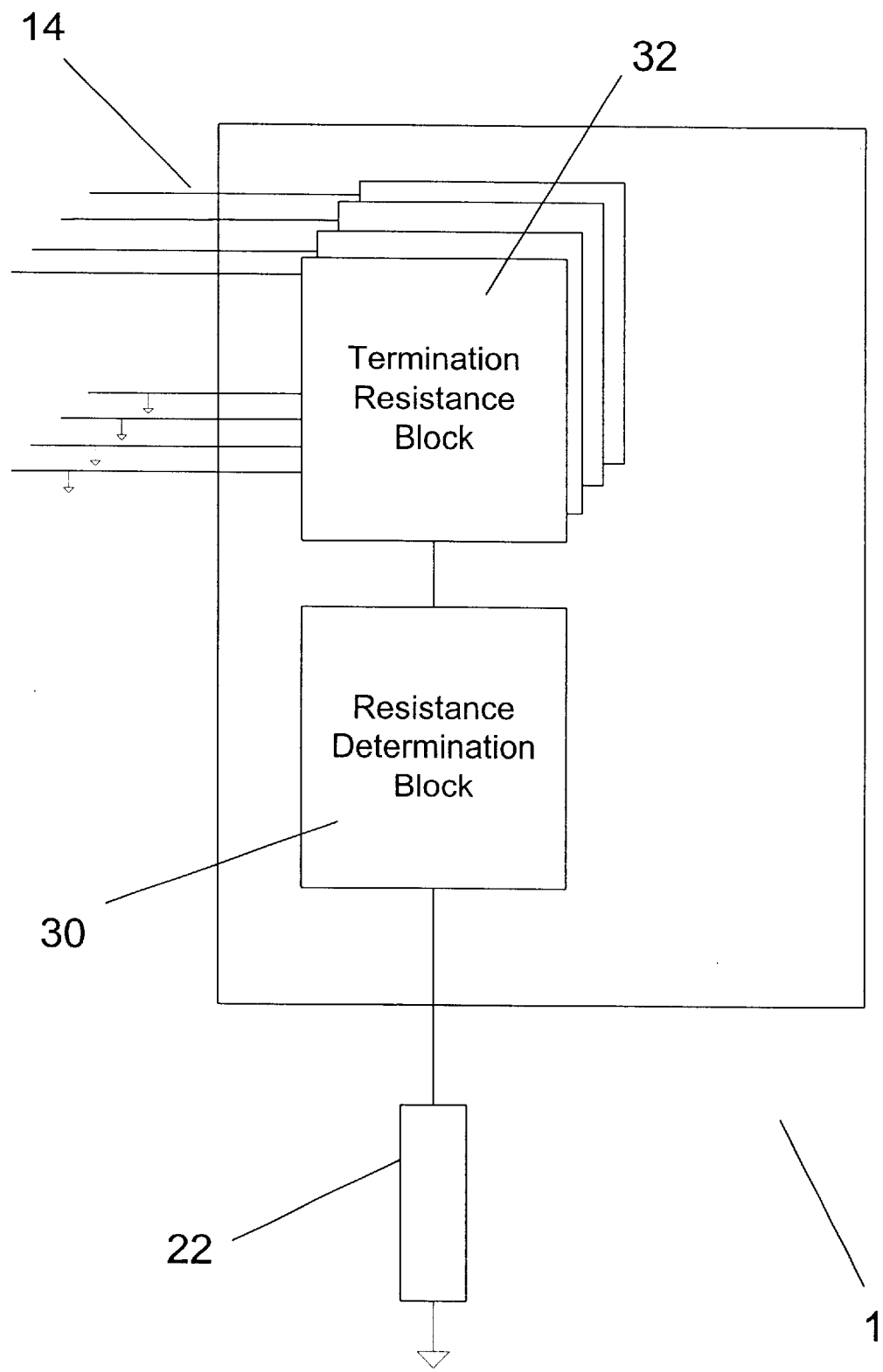
FIG. 2 is a block diagram schematically illustrating the components of a termination block.

One embodiment of a termination block is illustrated in FIG. 2. The termination block provides termination resistances across the transmission lines. The termination block includes a number of termination resistance blocks 32. Each termination resistance block is connected across a transmission line and ground plane pair, or in various embodiments across a differential transmission line pair.

The resistance of each termination resistance block is controlled by a signal provided by a resistance determination block 30. In one embodiment the signal is a plurality of signals provided by, for example, a bus. In such an embodiment, the signals, which in one embodiment are digital signals, form a code controlling the resistance. This may be done, for example, with each of the signals controlling a finite resistance. Alternatively, the signals may form a bit pattern controlling the resistances. In a further embodiment a single signal is used, with the variation of the signal over a time period determining the resistances. The resistance determination block determines the resistance of an external reference resistor 22 and outputs a signal related to the determined resistance value.

Figure 3:
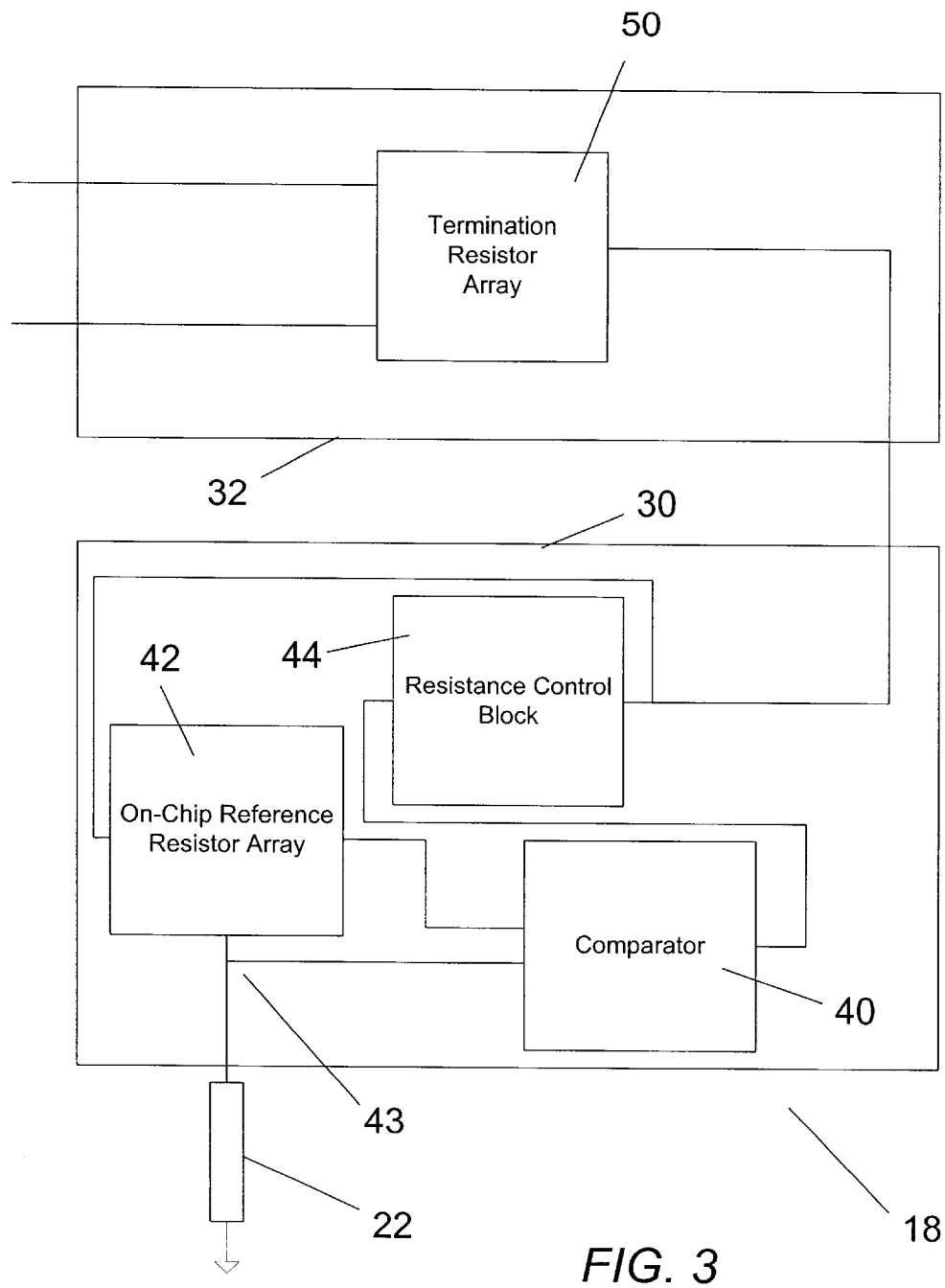
FIG. 3 is a block diagram schematically illustrating components of a termination block including a resistance determination block having a comparator, an on-chip reference resistor array and a resistance control block and a termination resistance block having a termination resistor array.

A termination block 18 connected to an external reference resistor is illustrated in FIG. 3. The termination block includes a comparator 40 that compares a signal from an external reference resistor and a signal from an on-chip reference resistor array 42. Accordingly, the comparator has inputs coupled to the on-chip reference resistor array 42 and to a node 43 to which the on-chip reference resistor array is connected and from which the external reference resistor 22 is connected to ground.

The comparator provides a signal of a first value at its output if the signal from the on-chip reference resistor array is greater than the signal from the external reference resistor. A signal of a second value is generated at the comparator output if the reverse is true.

The output signal generated by the comparator provides an input to a resistance control block. The resistance control block has an output coupled to the on-chip reference resistor array. The resistance control block generates an output that controls the resistance of the on-chip reference resistor array in response to the inputs provided by the comparator.

The resistance control block controls the resistance of the on-chip reference resistor array in response to inputs from the comparator. If the input provided by the comparator indicates that the relationship between the resistance of the external reference resistor and the resistance of the on-chip reference resistor array is less than a desired relationship, then the resistance control block provides a signal of a first value at its output. The resistance control block provides a signal of a second value at its output if the input provided by the comparator indicates that the relationship is greater than the desired relationship. The resistance control block continues generating outputs in response to the inputs provided by the comparator until the resistance of the array bears a predetermined relationship to the resistance of the external reference resistor.

In one embodiment, the on-chip reference resistor array is a device with a controllable variable resistance. The resistance of the on-chip reference resistor array is controlled by the signals output by the resistance control block.

Figure 3A:
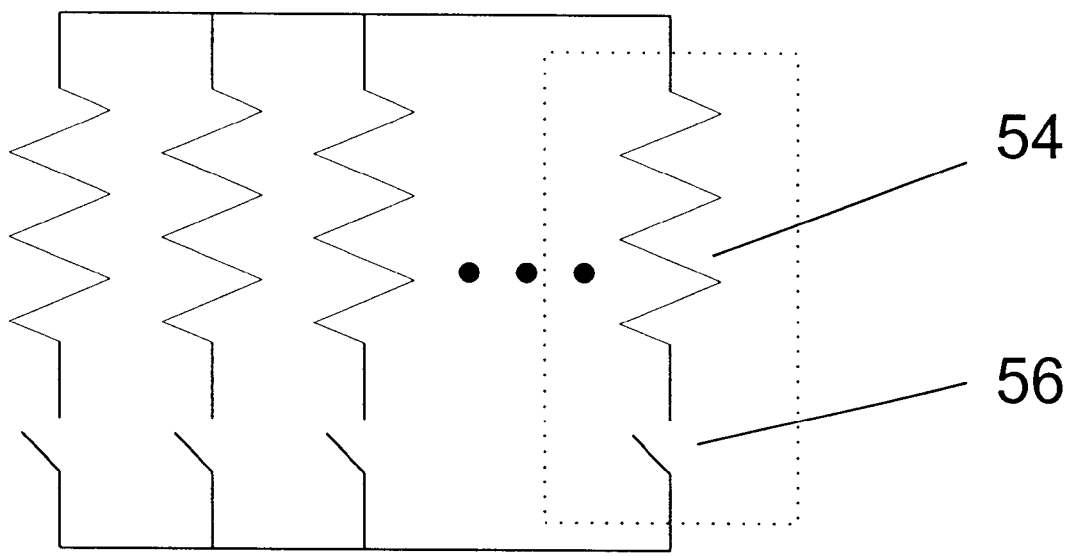
FIG. 3a is a semi-schematic circuit diagram illustrating an embodiment of an on-chip reference resistor array.

One embodiment of a on-chip reference resistor array is shown in FIG. 3a. The on-chip reference resistor array includes a network comprised of resistors 54 in which the resistors are switchably coupled by switching devices 56. As shown in FIG. 3a, the resistors 54 are in parallel and each coupled to a first node and through a switching device to a second node.

In other embodiments, the reference resistor array is a network of resistors switchably connected in series or switchably connected in a combination of series and parallel configurations. In still further embodiments, the on-chip reference resistor array is implemented using transistors in their linear range.

The output of the resistance control block is also provided as an input to the termination resistance blocks. Each termination resistance block includes a termination resistor array 50 connected across a transmission line and ground plane pair, or alternatively a differential pair, to form a termination resistance.

The resistance control block controls the resistances of the termination resistance arrays by generating output signals that are provided as inputs to the termination resistor arrays. These signals control the resistance of the termination resistance arrays in a similar way that the output signals of the resistance control block control the resistance of the on-chip reference resistor array.

If a known relationship exists between the resistance of the on-chip reference resistor array and the termination resistor array, then the resistance of the external reference resistor can be chosen to ensure that the resistances of the termination resistor arrays have desired resistances.

Figure 3B:
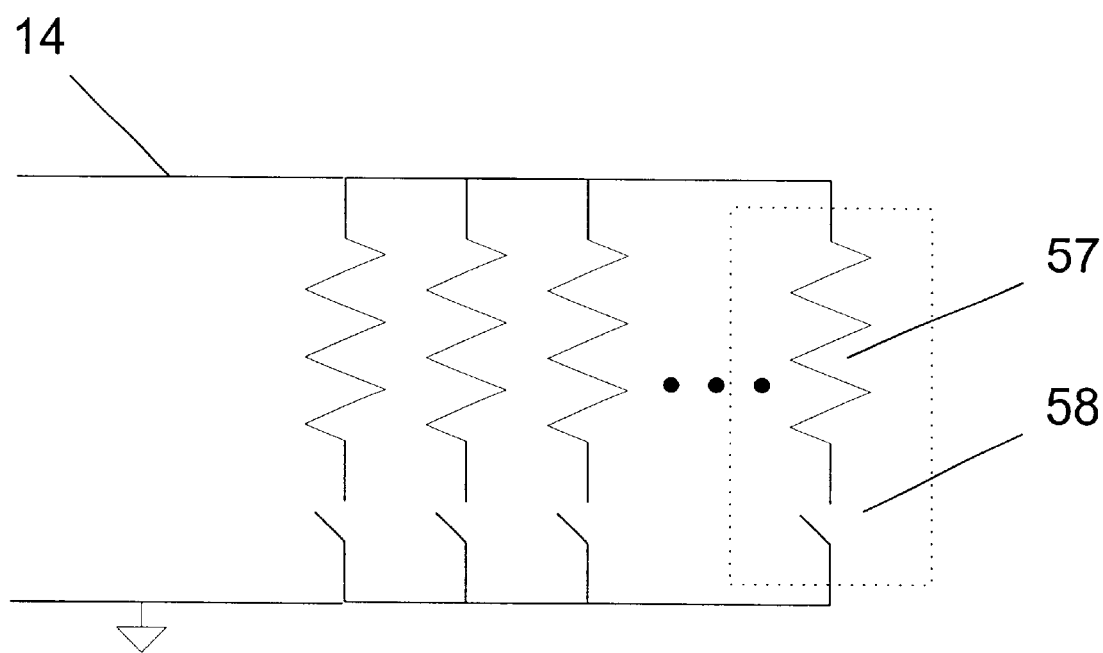
FIG. 3b is a semi-schematic circuit diagram illustrating an embodiment of a termination resistor array.

One embodiment of a termination resistor array is shown in FIG. 3b. The termination resistor array is similar to the on-chip reference resistor array of FIG. 3a. The termination resistor array includes a network comprised of resistors 57 switchably coupled to switching devices 58. As shown in FIG. 3b, the resistors 57 are in parallel each coupled to a transmission line and through a switching device to the ground plane. The switches control the flow of current through the resistors, which varies the termination resistance provided by the termination resistor array.

In other embodiments, the termination resistor array is a network of resistors switchably connected in series or switchably connected in a combination of series and parallel configurations. In still further embodiments, the on-chip reference resistor array is implemented using transistors in their linear range.

Figure 4:
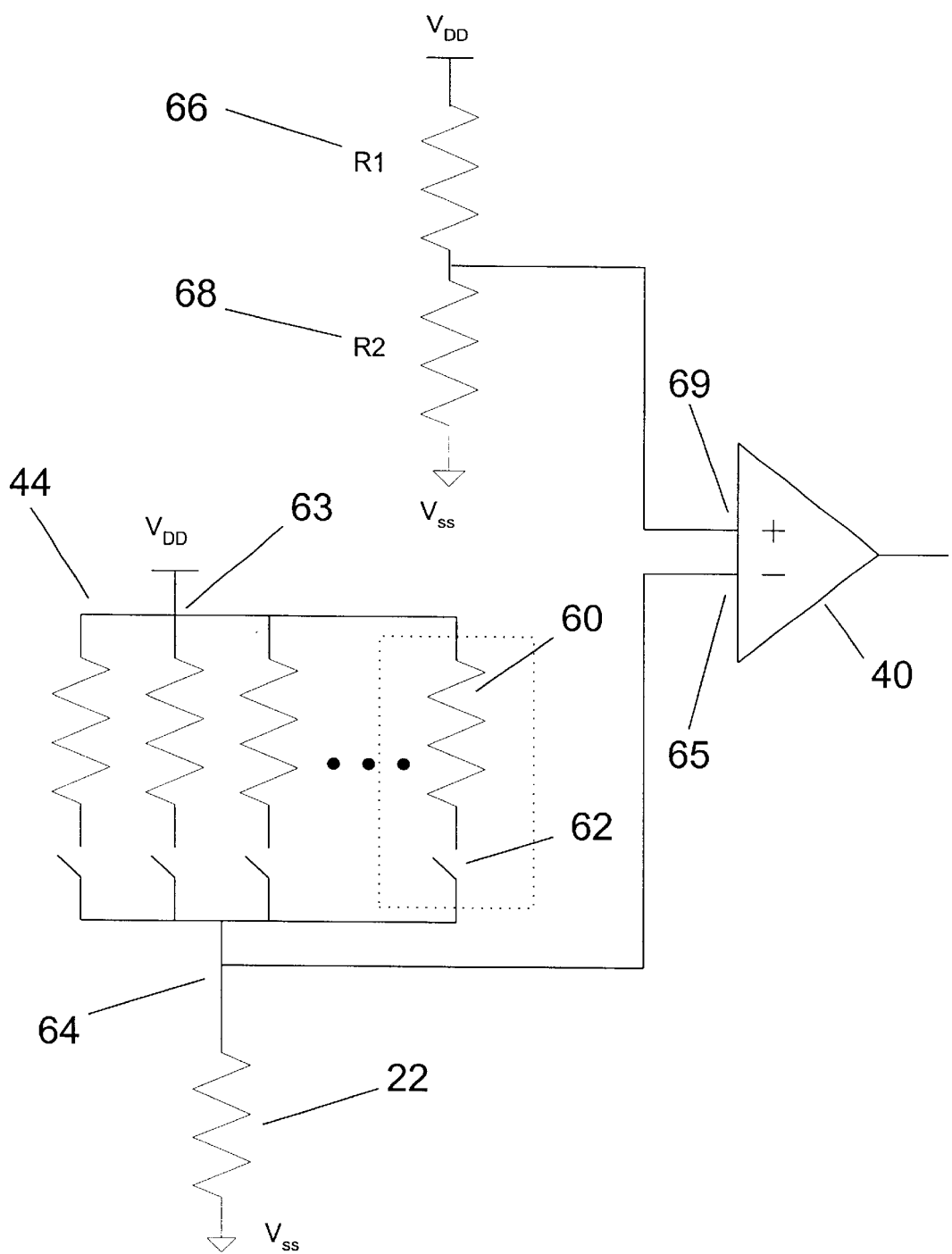
FIG. 4 is a semi-schematic circuit diagram illustrating an on-chip reference resistor array and a comparator of a resistance determination block and an external reference resistor.

The external reference resistor and a portion of the resistance determination block 30 including the first comparator and the on-chip reference resistor array in accordance with the present invention are illustrated in FIG. 4.

The on-chip reference resistor array includes a number of resistors 60 and switching devices 62. In one embodiment, each resistor is connected at one end to a common node 63 and at the other end to a switching device. The common node 63 is also connected to a power supply. In addition, each switching device is connected at one end to a resistor and to a second common node 64 at the other end.

A resistor network is formed by the resistors in the on-chip reference resistor array through which the switching devices enable current to flow. In one embodiment, the resistors are of substantially the same resistance and the resistance of the resistor network can be determined according to the relationship:

$$R_N = \frac{R}{i}$$

Where
- $R_N$ is the resistance of the resistor network;
- $i$ is the number of resistors through which current can flow and which are included in the resistor network; and
- $R$ is the resistance of each of the resistors in the resistor network.

The resistance of the resistor network is controlled using the switching devices. The switching devices increase the resistance of the resistor network by removing resistors from the network. The switching devices achieve this by preventing current from flowing through some of the resistors in the on-chip reference resistor array. The switching devices also decrease the resistance of the resistor network by adding resistors to the resistance network. The switching devices achieve this by allowing current to flow through resistors in the on-chip reference resistor array, which did not previously have current flowing through them.

The minimum resistance of the resistor network is achieved when the switching devices enable current to flow through all of the resistors in the on-chip reference resistor array. The greatest resistance is obtained when the switching devices prevent current from flowing through any of the resistors in the on-chip reference resistor array.

The external reference resistor connects between the common node 64 and a common ground. The common node 64 is also connected to an input 65 of the comparator 40. In this way, the on-chip reference resistor array and the external reference resistor form a voltage divider at the input 65 of the comparator 40. The resistors R1 66 and R2 68 form a second voltage divider at a second comparator input 69.

The output of the comparator 40 is generated based on the relative magnitude of the voltages at its inputs 65 and 69. In the embodiment shown in FIG. 4, the comparator generates an output signal that indicates whether the ratio of the resistance of the on-chip reference resistor array to the resistance of the external reference resistor is greater or less than the ratio of the resistances of R1 and R2.

Figure 5:
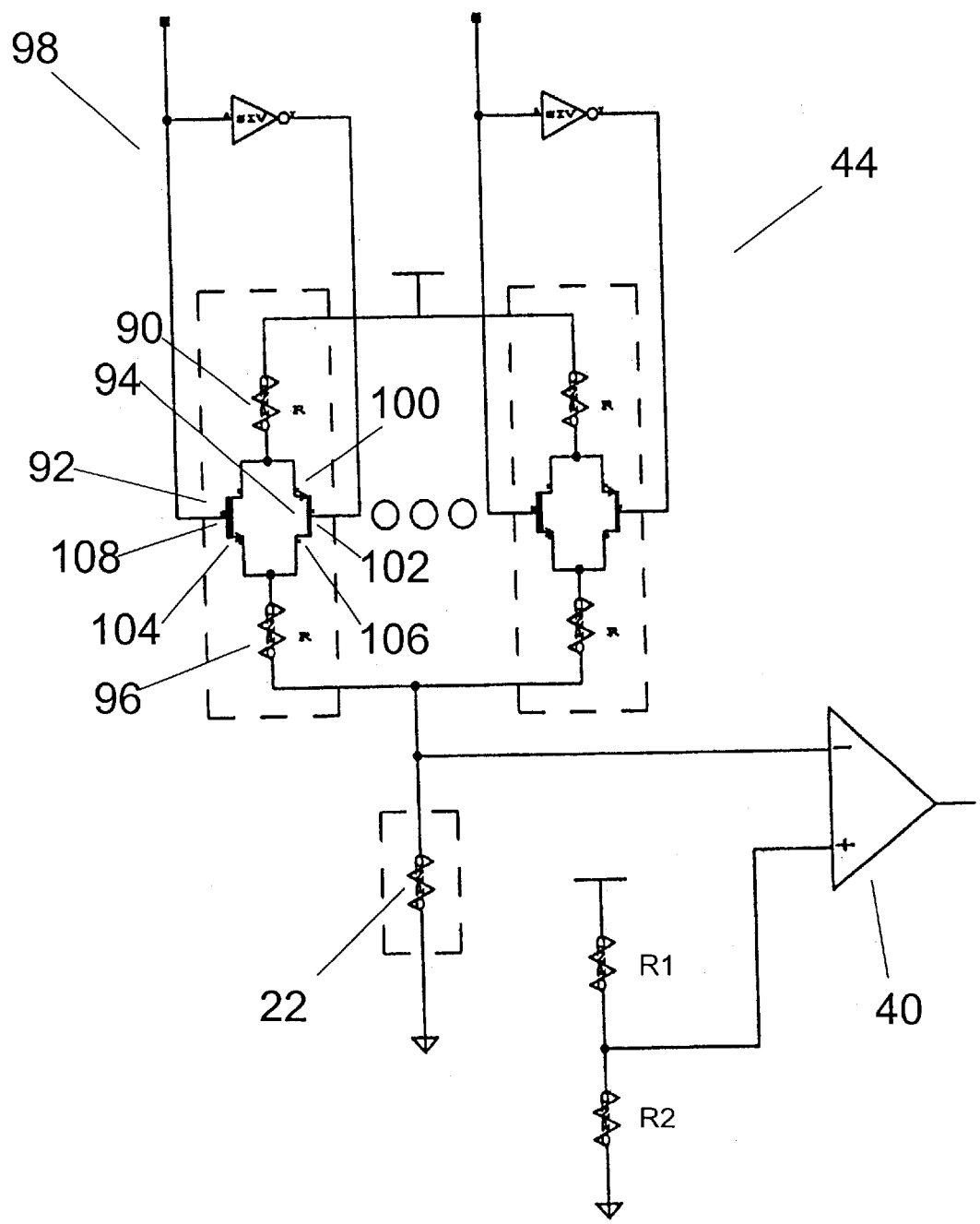
FIG. 5 is a semi-schematic circuit diagram illustrating an implementation of a on-chip reference resistor array using transistors.

One embodiment of the switching devices 62 and circuitry used to control the switching devices is illustrated in FIG. 5. In this embodiment, the on-chip reference resistor array comprises a number of similar resistor and transistor configurations connected in parallel. Each resistor and transistor configuration includes a first resistor 90 connected in series with a pair of transistors 92 and 94 and a second resistor 96.

The transistors 92 and 94 are configured to form a transmission gate (TG). The TG is made up of the parallel connection of a n-channel 92 and a p-channel 94 MOSFET, where the source of each transistor is connected to the drain of the other.

A TG is used in CMOS circuit design to pass or not pass a signal. Therefore, the TG performs the function of the switching device 62 of FIG. 4, by controlling the flow of current through the resistors 90 and 96 in response to signals generated by enabling logic 98.

The enabling logic is connected to the gates of the transistors 92 and 94 that form the TG. When the enabling logic is high, current flows through the TG, otherwise, the TG prevents current flow. The inputs to the enabling logic 98 are connected to the resistance control block 42. By providing appropriate inputs to the enabling logic, the resistance control block can form resistor networks within the on-chip reference resistor array 44.

Preferably, TG configurations are used to implement the switching devices because they are simple and have generally invariant effective resistances. The amount of current that flows through the transistor 94 is dependant on the voltage difference between the transistor source 100 and its gate 102. If the voltage difference is large relative to the voltage of the power supply, then a large amount of current will flow. If the voltage difference is smaller, then the current is reduced.

The TG maintains an effective resistance that does not substantially vary with the current flowing through the resistors to which it is connected. This is because the source 104 of the transistor 92 is connected to the drain 106 of the transistor 94. As the effective resistance of the transistor 94 increases, the voltage of the source of the transistor 92 relative to its gate 108 is increased. As a result, more current flows through the transistor 92 compensating for the decrease in the current flowing through the transistor 94. The reverse occurs when the current through the transistor 94 increases.

The combination of the transistors 92 and 94 causes the TG to have an effective resistance that does not vary substantially with the amount of current flowing through the resistors to which the TG is connected. In other embodiments, different transistor configurations that provide a generally constant resistance when the switching device is allowing current to flow and that can prevent current from flowing are used to implement the switching devices.

Figure 6:
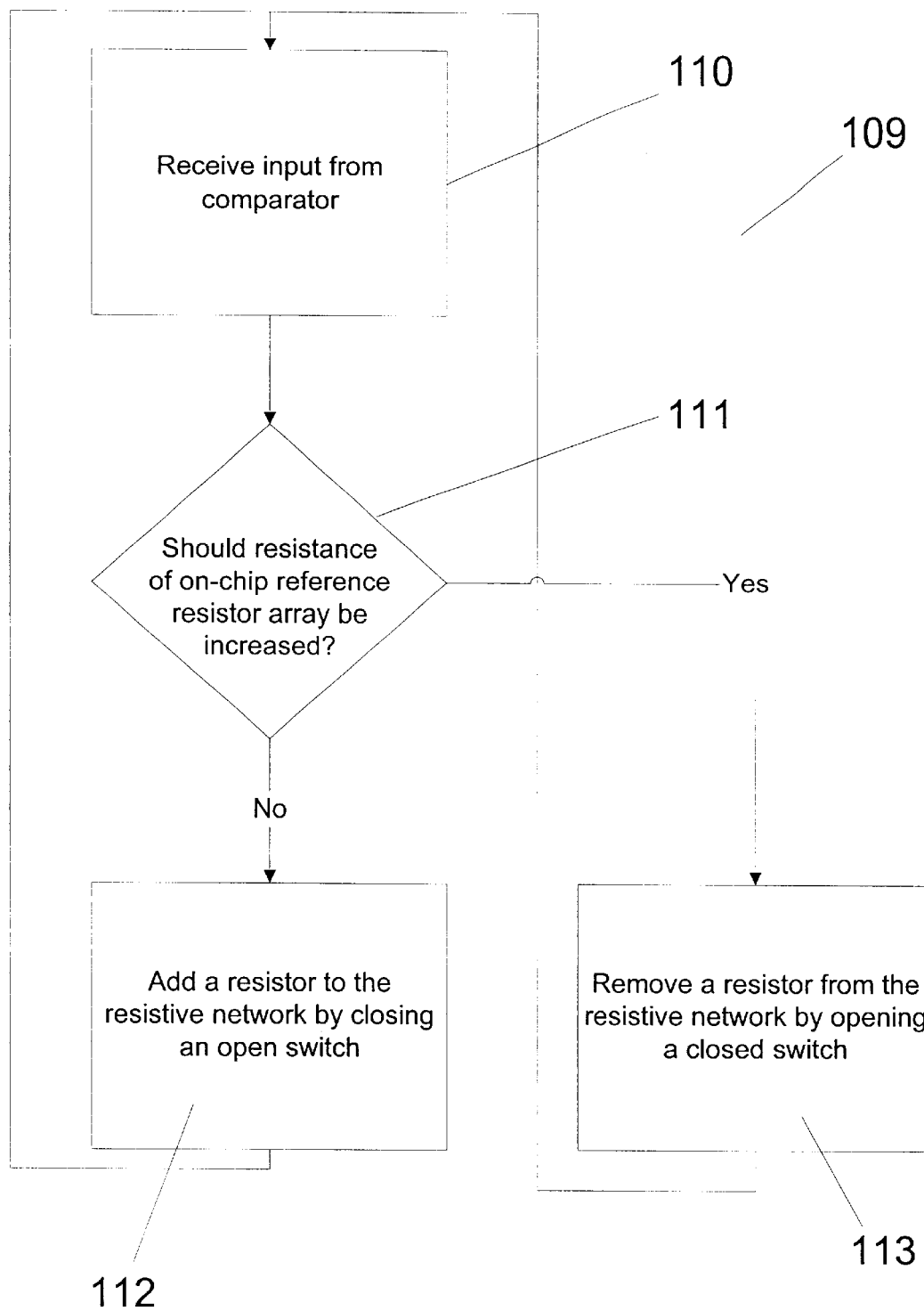
FIG. 6 is a flow diagram illustrating the steps used by a resistance control block to select a configuration for a resistor network within an on-chip reference resistor array.

FIG. 6 is a flow chart showing a process 109 used by the resistance control block 42 to control the resistance of the on-chip reference resistor array 44 in response to outputs from the comparator 40. Initially, the resistance control block generates outputs that configure the switching devices in the on-chip reference resistor array to provide a first resistor network.

The comparator then compares the ratio of the resistance of the first resistor network to the resistance of the external reference resistor with the desired ratio of the resistances of R1 and R2 and generates an output indicating which of the two ratios is greater. The comparator uses the result of the comparison to generate an output.

In the process block 110, the resistance control block receives the comparator output and performs a decision 111 to determine how the first resistor network should be adjusted in response to the comparator output. If the output from the comparator indicates that the resistance of the first resistor network is too large, then the resistance control block performs the operations in block 112.

The operations of block 112 cause the switching devices to create a second resistor network that includes one more resistor than the number of resistors in the first resistor network. In the event that the output from the comparator indicates that the resistance of the first resistor network is too small, then the resistance control block performs the operations in block 113. The operations of block 112 cause the switching devices to form a second resistor network having one resistor less than the number of resistors in the first resistor network.

Figure 7:
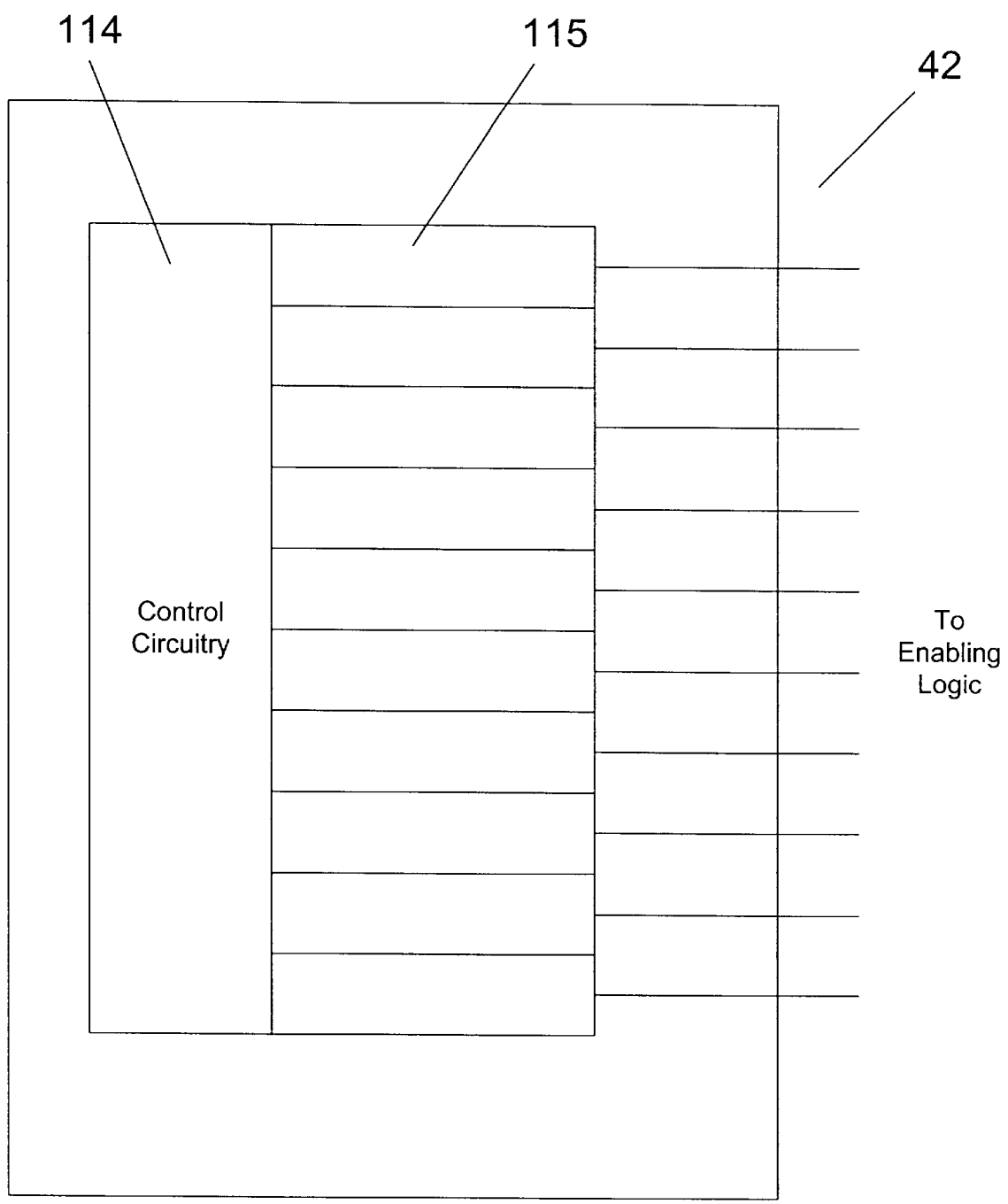
FIG. 7 is a block diagram schematically illustrating a resistor control block.

One embodiment of the resistance control block 42 configured to provide inputs to the enabling logic 98 is illustrated in FIG. 7. The resistance control block is implemented as an array of memory elements 115, where the output of each memory element is connected to the enabling logic of the on-chip reference resistor array. In this way, information stored in the memory elements controls the flow of current through the resistors of the on-chip reference resistor array and consequently controls the resistance of the resistor network formed within the on-chip reference resistor array.

In one embodiment, the information in the memory elements is stored in a digital form whereby a logic 1 causes a current to flow through a group of resistors in the on-chip reference resistor array and a logic 0 prevents the current from flowing.

The resistance control block also includes control circuitry 115 connected to each of the memory elements. The control circuitry is capable of altering the values stored in each of the memory elements in response to the comparator output.

In one embodiment of the resistance control block, the memory elements and control circuitry are implemented as a shift register. In this configuration each memory element corresponds to a bit in the shift register. The resistance of the on-chip reference resistor array is controlled by initializing all of the bits in the shift register to logic 0 and then shifting logic 1s into the register from one end and logic 0s from the other in response to the comparator output. Implementing resistance control block as a shift register ensures that an additional resistor will be added to or removed from the resistor network within the on-chip reference resistor array in response to the comparator output, unless there are no resistors to add to or remove from the resistor network.

Figure 8:
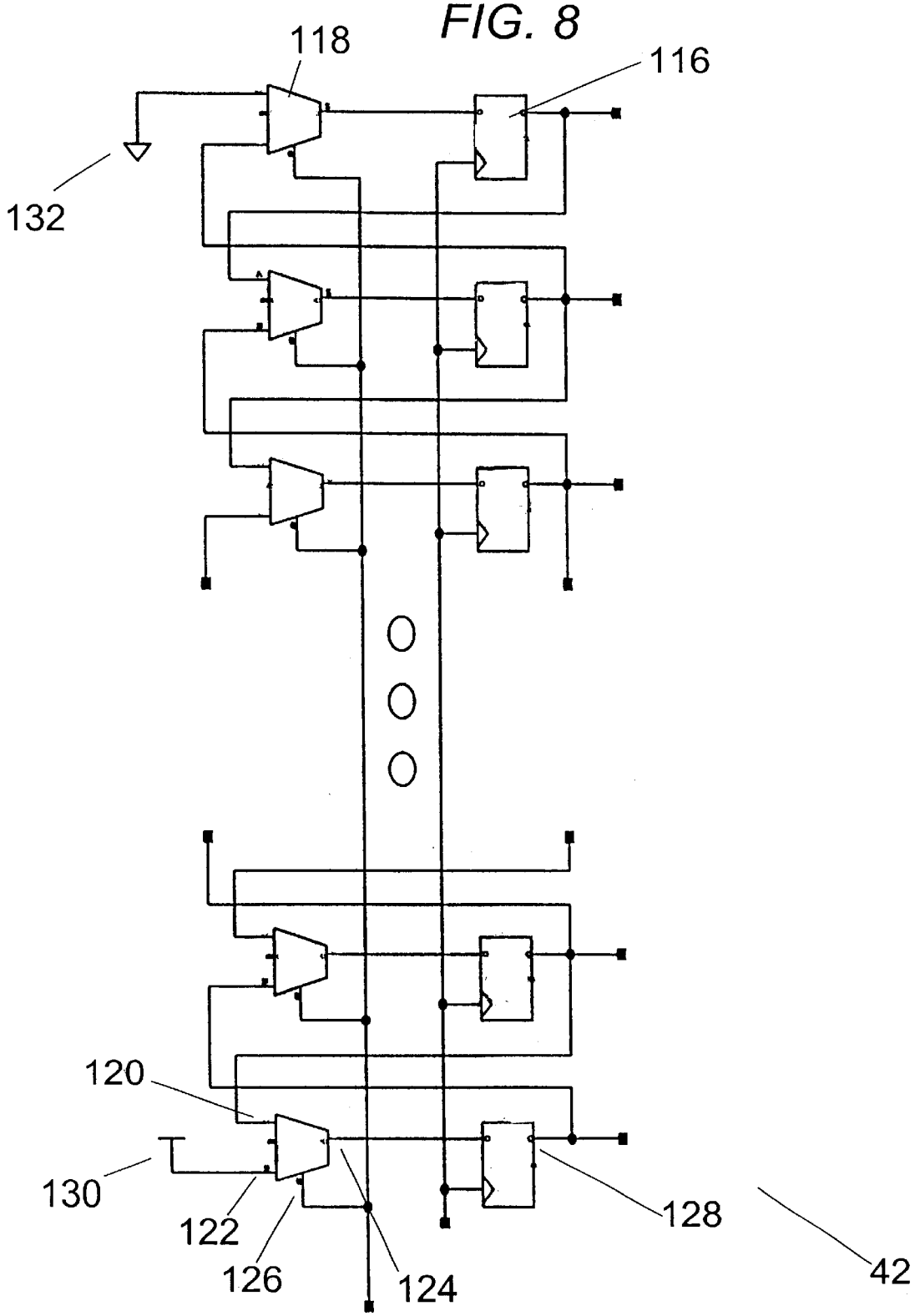
FIG. 8 is a semi-schematic circuit diagram illustrating a resistor control block implemented using D-type flip flops and two-input multiplexers.

An embodiment of the resistance control block 42 implemented as a shift register is illustrated in FIG. 8. In this embodiment, the memory elements are implemented using N D-type flip flops 116 and the control circuitry is implemented using N two-input multiplexers 118, where N is the number of resistors in the on-chip reference resistor array 44. Each multiplexer has two-inputs A 120 and B 122. The output of a multiplexer Z 124 at any given time is determined by the comparator output. The output of the comparator is input into the selection input S 126 of each multiplexer. If S is a logic 0, then input A is selected as the output Z otherwise input B is selected. A new value is stored in the D-type flip flop 116 every time the flip flop is clocked. The value stored is the multiplexer output Z at that time. Connections between the inputs of the multiplexers A and B and the outputs of the flip flops Q 128 are configured to implement a shift register, which loads logic 1s from one end 130 of the register and logic 0s from the other end 132. In this configuration a comparator output of logic 1 causes the resistance of the on-chip reference resistor array 44 to be decreased and a logic 0 causes it to be increased.

Figure 9:
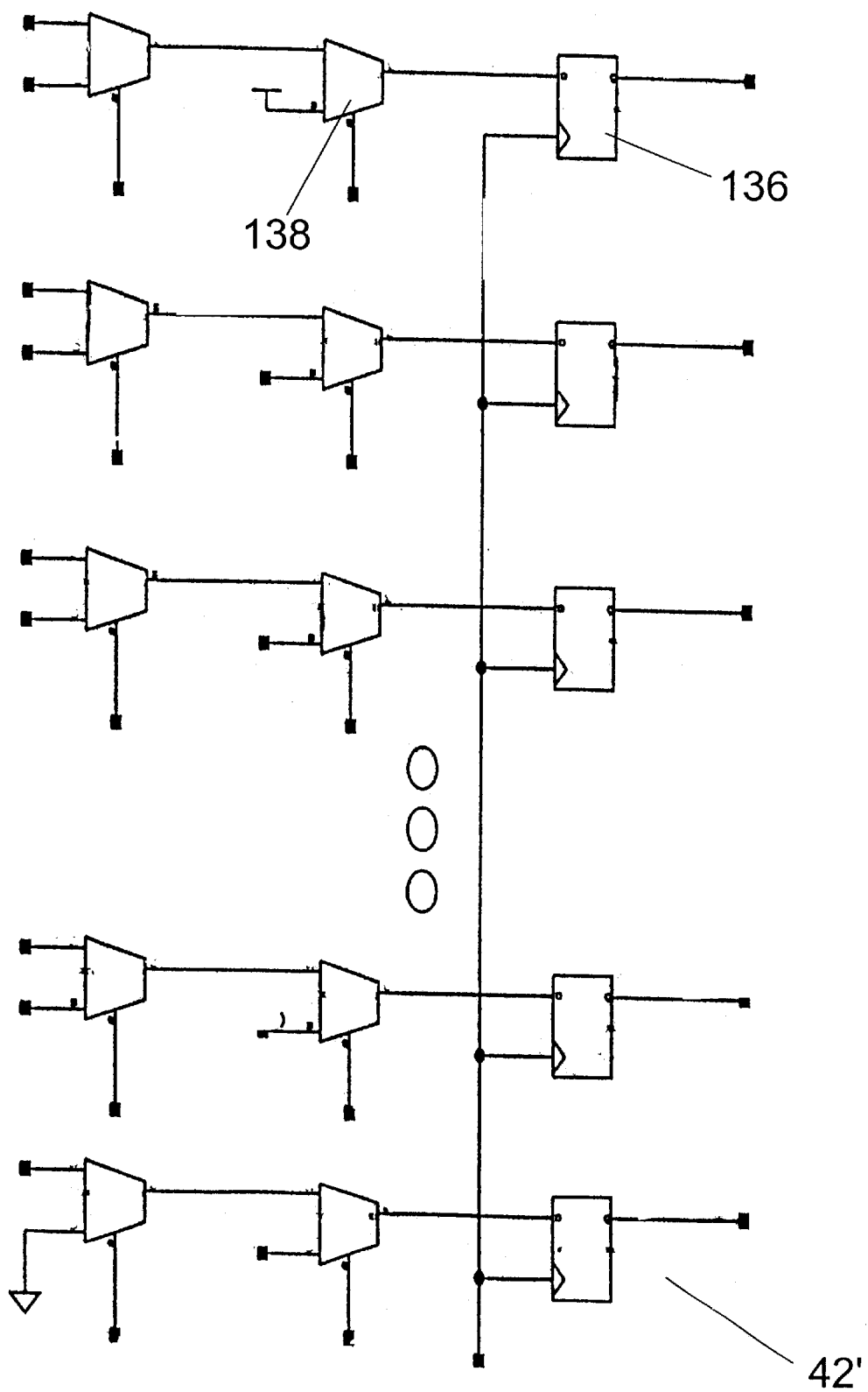
FIG. 9 is a semi-schematic circuit diagram illustrating another embodiment of a resistor control block optimized for use with a differential logic comparator.

FIG. 9 shows an alternative implementation of a shift register based resistance control block 42'. The implementation is optimized for use with a comparator 40 that uses differential logic and has two outputs instead of one. The resistance control block is constructed using N D-type flip flops 136 and 2 N two-input multiplexers 138, where N is the number of memory elements. In one embodiment, N is 10. However, other embodiments can use any value of N. The value of N is dependent upon the number of switching devices 62 in the on-chip reference resistor array. The accuracy with which the resistance of the on-chip reference resistor array can be matched to a predetermined resistance relative to the external reference resistor increases with N.

Figure 10:
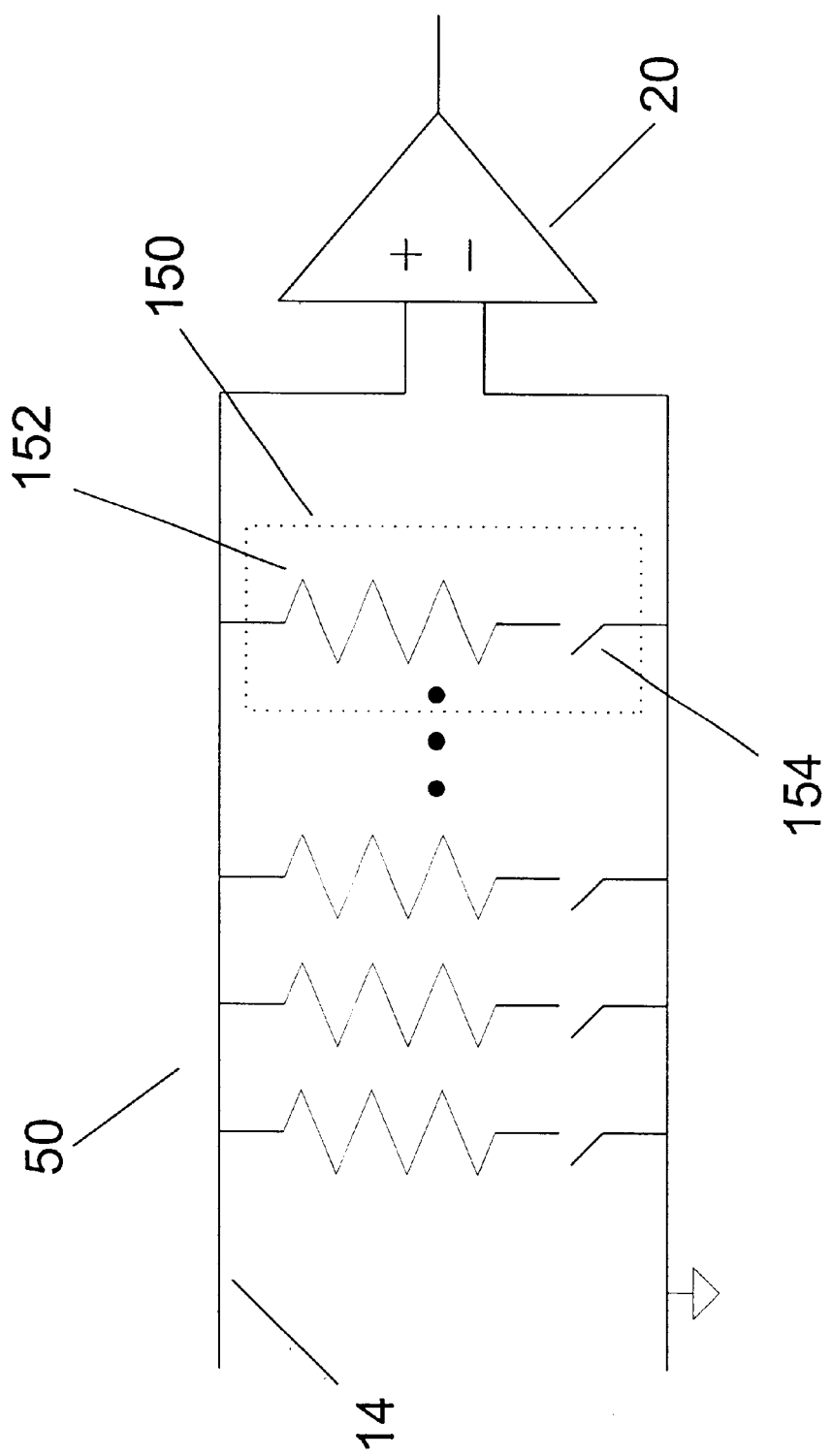
FIG. 10 is a semi-schematic circuit diagram illustrating a termination resistor array.

FIG. 10 shows one embodiment of a termination resistor array 50. The array is connected across the terminals of an input buffer 20, which is associated with a transmission line 14 and ground plane pair, or alternatively a differential pair. The termination resistor array includes a number of resistors 152 and switching devices 154. One end of each of the resistors is connected to the transmission line and the other end is connected to a switching device. The switching device is connected at one end to the resistor and at the other end to the ground plane. Preferably all of the resistors have the same resistance. The magnitude of the resistance of the termination resistor array is controlled by the switching devices. The switching devices 154 create a resistance network within the termination resistor array, in the same way that the switching devices 62 of FIG. 4 create a resistor network within the on-chip reference resistor array 46.

Figure 11:
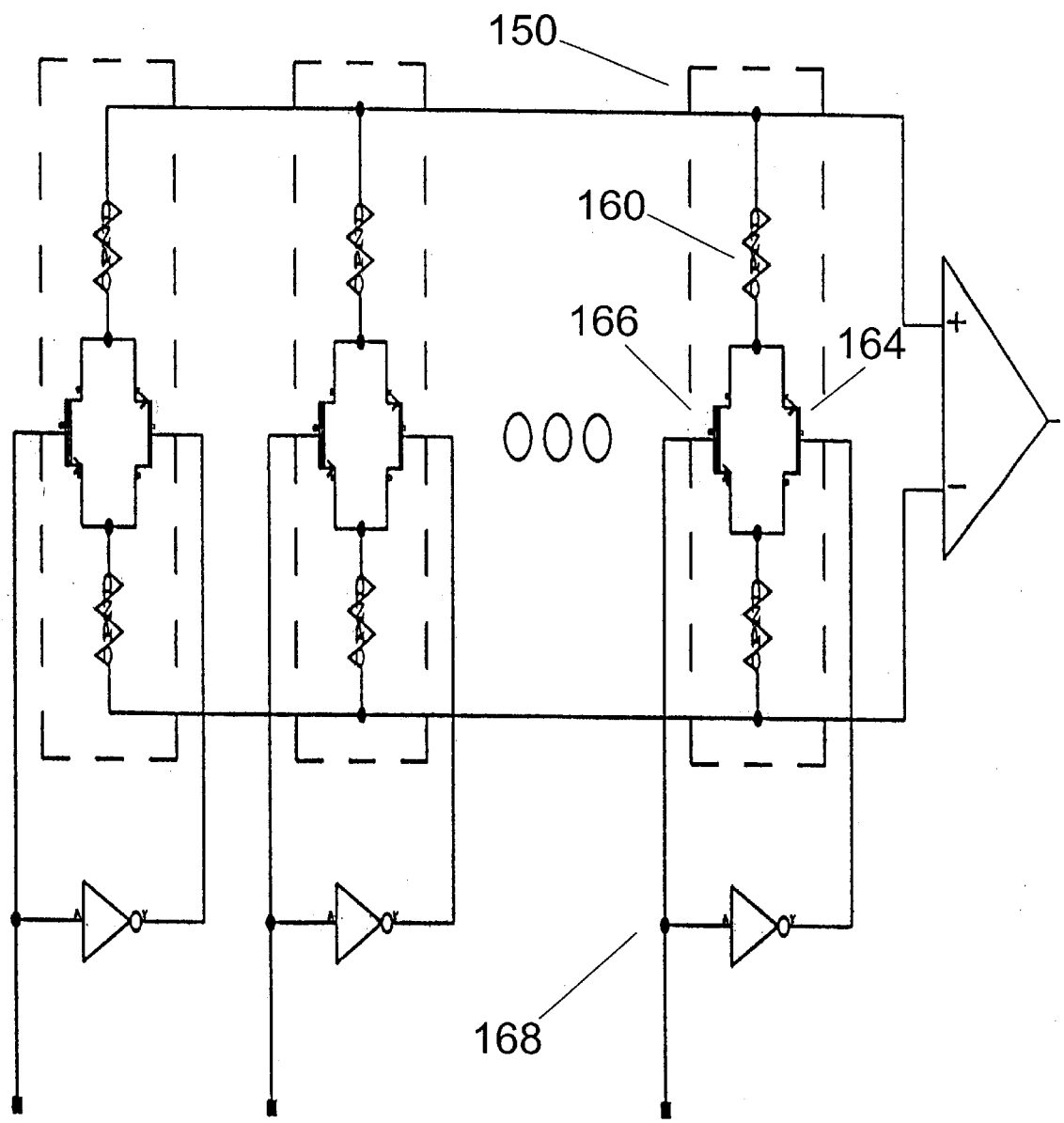
FIG. 11 is a semi-schematic circuit diagram illustrating a termination resistor array implemented using transistors.

One embodiment of the switching devices 154 is illustrated in FIG. 11. In this embodiment, the termination resistor array 50 comprises a number of resistor and transistor configurations 150. Each resistor and transistor configuration includes a first resistor 160 in series with a TG formed by the transistors 162 and 164. The TG is also connected in series with a second resistor 166.

The transistors 162 and 164 perform the functions of the switching device 154 of FIG. 10 by allowing current to flow through the resistors 160 and 166 in response to inputs from enabling logic 168, which is connected to the gates of the transistors.

The enabling logic is driven by outputs from the resistance control block. Signals provided by the enabling logic configure the termination resistor arrays to have predetermined resistances relative to the resistance of the external reference resistor.

Figure 12:
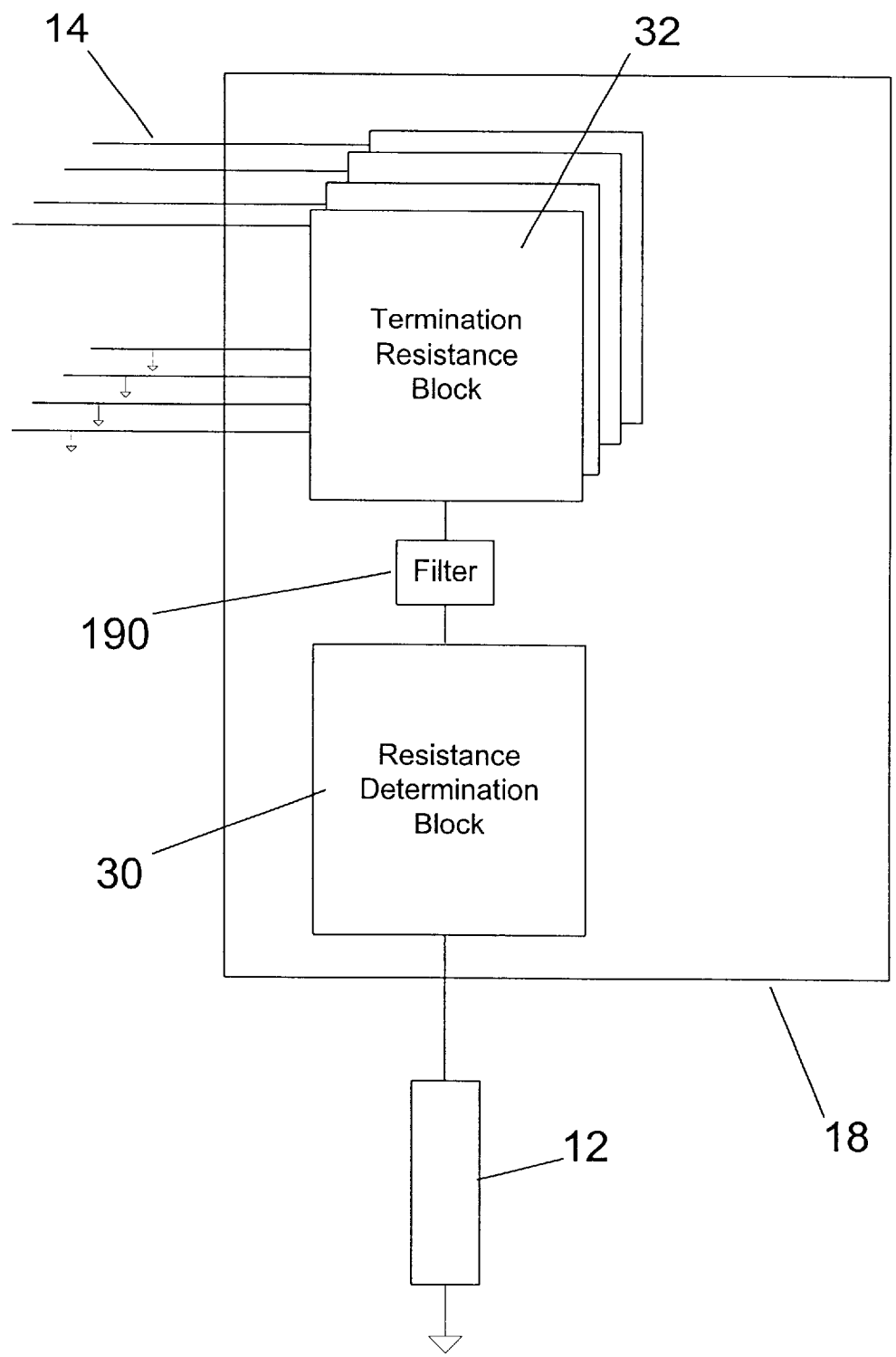
FIG. 12 is a block diagram schematically illustrating a termination block that uses digital filters to filter signals between a resistance determination block and a termination resistance block.

In another embodiment of the termination block in accordance with the present invention, shown in FIG. 12, digital filters 190 are connected between the termination resistance comparator block 30 and the termination resistance control blocks 32. The filters prevent unwanted transitions in the resistance of the termination resistor array in response to oscillations of the on-chip reference resistor array 44.

The resistance control block 42 causes oscillation in the resistance of the on-chip reference resistor array. Oscillation occurs because the resistance of the on-chip reference resistor array is generally not configurable to have exactly the desired resistance relative to the external reference resistor 22. Therefore, the resistance control block causes the resistance of the on-chip reference resistor array to oscillate between two resistances $R_L$ and $R_G$, where $R_L$ is less than the resistance of the external reference resistor and $R_G$ is greater than the resistance of the external reference resistor 22. For the embodiment of the on-chip reference resistor 44 of FIG. 5 and of the resistance control block 42 of FIG. 8, the values of $R_L$ and $R_G$ are $R/i$ and $R/(i-1)$, where R is the resistance of the resistors 92 and 94 and i is the number of branches of the on-chip reference resistor array 44 included in the resistance network with resistance $R_L$.

Oscillation in the resistance of the termination resistor array in response to oscillations in the resistance of the on-chip reference resistor array are limited by the digital filters. In other embodiments, the frequency of the oscillations of the resistance of the on-chip reference resistor array 44 is reduced by incorporating hysteresis into the first comparator 40.

In other embodiments, additional logic is provided within the digital filters 190, which is used to monitor the value of the on-chip reference resistor or to override the on-chip reference resistor value. In one embodiment, the additional logic is connected to the memory elements 114 of the resistance control block 42 and enables the monitoring of the resistance of the on-chip reference resistor. In another embodiment, the additional logic is connected to the enabling logic of the on-chip reference resistor array and/or the resistance control block 42 and provides inputs that can control the resistance of the on-chip reference resistor 46. In this way, the additional logic is able to control the termination resistance independently of the value of the external reference resistor.

The embodiments of the termination block 18 of FIG. 1 described above are implemented using digital circuits. The same methods described above can also be used in alternative embodiments that are implemented using analogue circuits. For example, in one embodiment analog signals are provided to gates and transistors operating in the linear region, with the transistors providing an adjustable resistance used as termination and reference resistors.

While the above description contains many specific embodiments of the invention, these should not be construed as limitations on the scope of the invention, but rather as an example of one embodiment thereof. Many other variations are possible. Accordingly, the scope of the invention should be determined not by the embodiments illustrated, but by the appended claims and their equivalents.

What is claimed is:

1. A printed circuit board comprising:
   a first reference resistor;
   an integrated circuit comprising:
      a resistor network; and
      control circuitry; and
      a transmission line connected to said integrated circuit;
      wherein said resistor network provides a termination resistance across said transmission line; and
      wherein configuration of said resistor network is capable of being controlled by said control circuitry such that the resistance of said resistor network is related to the resistance of said reference resistor.

2. The printed circuit board of claim 1, wherein:
   said integrated circuit further comprises:
      a reference resistor network; and
      reference resistor network control circuitry; and
      wherein configuration of said reference resistor network is capable of being controlled by said reference resistor control circuitry such that the resistance of said reference resistor network is related to the resistance of said reference resistor; and
      wherein configuration of said resistor network is capable of being controlled by said control circuitry such that the resistance of said resistor network is related to the resistance of said reference resistor network.

3. The printed circuit board of claim 1, wherein the resistance of said external reference resistor is chosen such that the resistance of said resistor network is substantially the same as the characteristic impedance of said transmission line.

4. The printed circuit board of claim 1 further comprising a configurable reference resistor array comprised of a plurality of parallel resistive branches wherein resistance of said reference resistor array is related to the resistance of said first reference resistor and wherein the resistance of said resistor network is related to the resistance of said reference resistor network.

5. The printed circuit board of claim 4 wherein the parallel resistive branches each comprise one or more resistors serially coupled with a switching device.

6. The printed circuit board of claim 5 wherein the switching devices comprise a pair of transistors configured to form a transmission gate.

7. The printed circuit board of claim 5 further comprising array enabling logic coupled to each of said switching devices to add or subtract resistive branches from the configurable reference resistor array to control resistance of the configurable reference resistor array.

8. The printed circuit board of claim 7 further comprising a comparator for generating a comparator output signal in accordance with difference between resistance of the reference resistor array and the resistance of the first reference resistor.

9. The printed circuit board of claim 8 further comprising reference resistor array control circuitry for controlling the resistance of the configurable reference resistor array in response to the comparator output signal.

10. The printed circuit board of claim 8 further comprising a first voltage divider coupled to a first input of the comparator and wherein the first reference resistor and the configurable reference resistor array form a second voltage divider coupled to a second input of the comparator and wherein the comparator outputs a signal in accordance with relative magnitude of voltages at first and second inputs.

11. The printed circuit board of claim 9 wherein the reference resistor array control circuitry comprises an array of memory elements and a memory element control circuit wherein the control circuitry alters value stored in the memory elements in response to comparator output signal.

12. The printed circuit board of claim 11 wherein each memory element is coupled to said array enabling logic and wherein said array enabling logic opens and closes said switching devices to control resistance of the configurable reference resistor array in response to the value stored in said memory elements.

13. The printed circuit board of claim 11 wherein the memory elements and memory element control circuitry comprise a shift register, wherein each memory element corresponds to a bit in shift register.

14. The circuit of claim 7, wherein said array enabling logic includes a digital filter.

15. The printed circuit board of claim 1 wherein the resistor network comprises a plurality of parallel resistive branches.

16. The printed circuit board of claim 15 wherein the parallel resistive branches each comprise one or more resistors serially coupled with a switching device.

17. The printed circuit board of claim 16 wherein the switching devices comprise a pair of transistors configured to form a transmission gate.

18. The printed circuit board of claim 16 further comprising array enabling logic coupled to said switching devices to add or subtract resistive branches from the resistor network in response to commands from the control circuitry.

19. A circuit on an integrated circuit for terminating a transmission line, where said integrated circuit is capable of being connected to an external reference resistor, comprising:
   a first configurable resistor array;
   a comparator;
   wherein said comparator is used to configure said first configurable resistor array to form a first resistor network that has a resistance of a predetermined relationship to said reference resistance;

a second configurable resistor array;

wherein said second configurable resistor array is configured to form a second resistor network; and wherein resistance of said second resistor network is of a predetermined relationship to the resistance of said first resistance network.

20. The circuit of claim 19, wherein said second resistor network provides a termination resistance for said transmission line.

21. The circuit of claim 19, further comprising:

additional logic;

wherein said additional logic can be used to determine the resistance of said first resistor network.

22. The circuit of claim 21, wherein:

said additional logic can change the configuration of said second configurable resistor array to form a third resistor network; and said third resistor network having a resistance independent of the resistance of said first resistance network.

23. A circuit on an integrated circuit for terminating a transmission line comprising:

a resistor array comprising:
 a plurality of resistor and transistor configurations connected in parallel, wherein each resistor and transistor configuration comprises:
  an array resistor; and
  an array switching device; and
 array enabling logic connected to each of said switching devices, wherein one or more of said switching devices is a pair of transistors configured to form a transmission gate.

24. The circuit of claim 23 further comprising a comparator for generating a comparator output signal in accordance with difference between resistance of the resistor array and resistance of a reference resistor and resistor array control circuitry coupled to the array enabling logic for controlling the resistance of the configurable reference resistor array in response to the comparator output signal.

25. The circuit of claim 24 wherein resistor array control circuitry comprises a shift register comprising a plurality of memory locations and shifting logic, and wherein each memory location in said shift register is coupled to a unique input of said array enabling logic and said comparator output is coupled to said shifting logic.

26. The circuit of claim 23 wherein the pair of transistors configured to form a transmission gate comprises a pair of complementary transistors coupled in parallel.

27. The circuit of claim 26 wherein the pair of complementary transistors configured to form a transmission gate have inverted gate voltages.

28. The circuit of claim 26 wherein the pair of complementary transistors comprises an n-channel MOSFET coupled in parallel with a p-channel MOSFET, wherein a source of the n-channel MOSFET is coupled to a drain of the p-channel MOSFET and a source of the p-channel MOSFET is coupled to a drain of the n-channel MOSFET.

29. The circuit of claim 28 wherein the pair of transistors are responsive to the array enabling logic for controlling current flow through corresponding array resistor.

30. The circuit of claim 29 wherein a gate of the -channel MOSFET is coupled to the array enabling logic and wherein an inverter is coupled between a gate of the p-channel MOSFET and the array enabling logic to invert gate voltage of the p-channel MOSFET.

31. A circuit on an integrated circuit for terminating a transmission line comprising:

a resistor array comprising:
 a plurality of resistor and transistor configurations connected in parallel, wherein each resistor and transistor configuration comprises:
  an array resistor,
  an array switching device, and
  array enabling logic connected to each of said array switching devices;
 a resistance control block connected to said array enabling logic;
 a comparator comprising two inputs and an output; and
 wherein the resistor array is connected to one of said inputs and said output is connected to said resistance control block.

32. The circuit of claim 31, wherein:

said resistance control block is a shift register comprising a plurality of memory locations and shifting logic;

said array enabling logic comprises a plurality of inputs; and each memory location in said shift register is connected to one of said array enabling logic inputs; and said comparator output is connected to said shifting logic.

33. The circuit of claim 31, wherein:

said array enabling logic includes a digital filter.

34. A method of terminating a transmission line at an integrated circuit mounted on a printed circuit board comprising the steps of:

controlling the configuration of a termination resistor network on said integrated circuit such that the resistance of said termination resistor network is related to the resistance of a reference resistor located on said printed circuit board, wherein the resistance of said reference resistor is chosen such that the resistance of said termination resistor network is substantially the same as the characteristic impedance of said transmission line.

* * * * *

UNITED STATES PATENT AND TRADEMARK OFFICE
CERTIFICATE OF CORRECTION

PATENT NO.   : 6,605,958 B2
DATED        : August 12, 2003
INVENTOR(S)  : Dave Bergman et al.

It is certified that error appears in the above-identified patent and that said Letters Patent is hereby corrected as shown below:

Column 7,
Line 65, "2 N" should be -- 2N --

Signed and Sealed this

Twenty-second Day of June, 2004

JON W. DUDAS
*Acting Director of the United States Patent and Trademark Office*